United States Patent
Vuletic et al.

(10) Patent No.: US 10,418,783 B1
(45) Date of Patent: Sep. 17, 2019

(54) SEMICONDUCTOR LASER WITH INTRA-CAVITY ELECTRO-OPTIC MODULATOR

(71) Applicants: Vladan Vuletic, Cambridge, MA (US); Boris Braverman, Calgary (CA); Akio Kawasaki, Palo Alto, CA (US); Megan Yamoah, Cambridge, MA (US); Edwin Eduardo Pedrozo Penafiel, Cambridge, MA (US)

(72) Inventors: Vladan Vuletic, Cambridge, MA (US); Boris Braverman, Calgary (CA); Akio Kawasaki, Palo Alto, CA (US); Megan Yamoah, Cambridge, MA (US); Edwin Eduardo Pedrozo Penafiel, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/038,927

(22) Filed: Jul. 18, 2018

(51) Int. Cl.
*H01S 5/14* (2006.01)
*H01S 3/107* (2006.01)
*H04B 10/50* (2013.01)
*H01S 5/125* (2006.01)
*H01S 5/026* (2006.01)
(Continued)

(52) U.S. Cl.
CPC .............. *H01S 5/146* (2013.01); *G02B 27/10* (2013.01); *H01S 3/107* (2013.01); *H01S 5/0064* (2013.01); *H01S 5/0085* (2013.01); *H01S 5/0262* (2013.01); *H01S 5/125* (2013.01); *H01S 5/141* (2013.01); *H04B 10/504* (2013.01)

(58) Field of Classification Search
CPC .......... H01S 5/14; H01S 5/146; H01S 5/0064; H01S 3/107
See application file for complete search history.

(56) References Cited

U.S. PATENT DOCUMENTS

| 4,907,237 A | 3/1990 | Dahmani et al. |
| 6,295,308 B1 | 9/2001 | Zah |
| 7,161,725 B2 | 1/2007 | Fraser et al. |
(Continued)

OTHER PUBLICATIONS

International Search Report and Written Opinion in International Patent Application No. PCT/US2018/041107, 8 pages.
(Continued)

*Primary Examiner* — Michael Carter
(74) *Attorney, Agent, or Firm* — Smith Baluch LLP

(57) ABSTRACT

An optical and electronic feedback system can be used to significantly narrow the linewidth of distributed Bragg reflector lasers (DBRs) by reducing the high-frequency noise in the laser spectrum. An optical feedback path reduces the high-frequency noise of the laser. An electric-optic modulator placed inside of this feedback path applies electronic feedback with a very large bandwidth, allowing for robust and stable locking to a reference cavity. In addition, the servo-electronic component greatly increases the long-term stability of the laser locking to an external reference cavity, allowing for low noise, long-term operation of the laser. Specifically, it suppresses the frequency noise spectral density and narrows the total linewidth from a free-running value of 100 kHz to 30 Hz. The resulting modified DBR laser is both precise and stable and has applications in optical clocks, quantum information science, and precision metrology.

20 Claims, 4 Drawing Sheets

(51) Int. Cl.
*H01S 5/00* (2006.01)
*G02B 27/10* (2006.01)

(56) References Cited

U.S. PATENT DOCUMENTS

| | | |
|---|---|---|
| 8,681,827 B2 | 3/2014 | Maleki et al. |
| 9,200,960 B2 | 12/2015 | McKeever et al. |
| 2007/0041409 A1 | 2/2007 | Sudarshanam et al. |
| 2014/0204387 A1 | 7/2014 | Narayanan et al. |

OTHER PUBLICATIONS

Alnis et al., Subhertz linewidth diode lasers by stabilization to vibrationally and thermally compensated ultralow-expansion glass Fabry-Pérot cavities. 2008. Phys. Rev. A, 77:053809. 9 pages.

Black, An introduction to Pound-Drever-Hall laser frequency stabilization. Am. Assoc. of Phys. Teach. 69, 79 (2001). 10 pages.

Dahmani et al., Frequency stabilization of semiconductor lasers by resonant optical feedback, Optics Letters 12, 876 (1987), pp. 876-878.

Domenico et al., Simple approach to the relation between laser frequency noise and laser line shape, Appl. Opt. 49, 4801 (2010). 7 pages.

Hall et al., Coherent Light Emission from GaAs Junctions, Phys. Rev. Lett. 9, 366 (1962). 4 pages.

Hudson et al., Mode-locked fiber laser frequency-controlled with an intracavity electro-optic modulator. Optics Letters 30, 2948 (2005). 3 pages.

Kéfélian et al., Ultralow-frequency-noise stabilization of a laser by locking to an optical fiber-delay line. Optics Letters, 34, 914 (2009). 3 pages.

Lenstra et al., Coherence Collapse in Single-Mode Semiconductor Lasers Due to Optical Feedback. IEEE Journal of Quantum Electronics 21, 674 (1985). 6 pages.

Lewoczko-Adamczyk et al., Ultra-narrow linewidth DFB-laser with optical feedback from a monolithic confocal Fabry-Perot cavity. Opt. Express 23, 9705 (2015). 5 pages.

Liang et al., "Whispering-gallery-mode-resonator-based ultranarrow linewidth external-cavity semiconductor laser," Opt. Lett. 35(16): 2822-24 (Aug. 15, 2010).

Liang et al., Ultralow noise miniature external cavity semiconductor laser. Nat Commun. Jun 24, 2015;6:7371. doi: 10.1038/ncomms8371. 6 pages.

Lin et al., Long-external-cavity distributed Bragg reflector laser with subkilohertz intrinsic linewidth. Opt. Lett. 37, 1989 (2012). 3 pages.

Ludlow et al., Compact, thermal-noise-limited optical cavity for diode laser stabilization at 1×10−15. Opt. Lett. 32, 641 (2007). 3 pages.

Monroe, Quantum information processing with atoms and photons. Nature 416, 238 (2002). 9 pages.

Petermann, External Optical Feedback Phenomena in Semiconductor Lasers. IEEE Journal of Selected Topics in Quantum Electronics 1, 480 (1995). 10 pages.

Ricci et al., A compact grating-stabilized diode laser system for atomic physics. Optics Communications 117, 541 (1995). 10 pages.

Samutpraphoot et al., Passive intrinsic-linewidth narrowing of ultraviolet extended-cavity diode laser by weak optical feedback. Opt. Express 22, 11592 (2014). 8 pages.

Wei et al., Subkilohertz linewidth reduction of a DFB diode laser using self-injection locking with a fiber Bragg grating Fabry-Perot cavity. Opt. Express 24, 17406 (2016). 10 pages.

Ye et al., Quantum State Engineering and Precision Metrology Using State-Insensitive Light Traps. Science 320, 1734 (2008). 6 pages.

SEMICONDUCTOR LASER WITH INTRA-CAVITY ELECTRO-OPTIC MODULATOR

GOVERNMENT SUPPORT

This invention was made with Government support under Grant No. N00014-17-1-2254 awarded by the Office of Naval Research. The Government has certain rights in the invention.

BACKGROUND

Narrow linewidth tunable lasers are fundamental components to experiments involving spectroscopy, cooling and trapping atoms, and quantum information science where they are often used to address atomic and molecular energy transitions. Since their introduction in the 1960s, diode laser systems have been consistently space-efficient and cost-effective tools for such experimentation. However, their intrinsic linewidths normally range from hundreds of megahertz to a few gigahertz, limiting their applications in precision spectroscopy and the control of narrow atomic transitions.

Some of the first efforts to narrow the linewidths of diode lasers yielded extended cavity diode lasers (ECDLs), distributed Bragg reflector (DBR) lasers, and fiber lasers. In general, ECDLs narrow the linewidth of a diode laser by using a diffraction grating to create an external cavity that amplifies a precise and stable wavelength of light. Linewidth reduction has also been demonstrated with feedback from a resonator as well as in distributed feedback (DFB) and DBR lasers. Adding passive external fiber optical feedback to a DBR laser yields sub-kilohertz linewidth narrowing in DBR lasers and traditional ECDLs. Active mechanisms for noise reduction in diode lasers include servo-electronic-based stabilization to a high-finesse ultra-stable cavity or Michelson interferometer, but the finite bandwidth of electrical feedback to the diode current or temperature makes it difficult to reduce high frequency noise.

SUMMARY

Embodiments of the present technology include methods of stabilizing semiconductor lasers. An example method includes emitting a laser beam from a semiconductor laser; transmitting the laser beam through an optical isolator; generating a feedback signal from a first portion of the laser beam transmitted through the optical isolator; modulating a second portion of the laser beam transmitted through the optical isolator with the feedback signal; and feeding the second portion of the laser beam into the semiconductor laser, e.g., through a reject port of the optical isolator, so as to narrow a linewidth of the laser beam.

Generating the feedback signal may include modulating the first portion of the laser beam with a local oscillator; coupling the first portion of the laser beam into a reference cavity; detecting light coupled out of the reference cavity with a photodetector in optical communication with the reference cavity; and processing a photodetector signal produced by the photodetector in response to detecting the light coupled out of the reference cavity to yield the feedback signal. If so, processing the photodetector signal can comprise mixing the photodetector signal with the local oscillator to yield a dispersion signal; integrating a first copy of the dispersion signal; amplifying a second copy of the dispersion signal; and combining the first copy of the dispersion signal and the second copy of the dispersion signal to produce the feedback signal.

Modulating the second portion of the laser beam can include transmitting the second portion of the laser beam through an external cavity having a free spectral range of at least 100 MHz. It can also include modulating the second portion of the laser beam over a bandwidth of at least 150 MHz, e.g., with an electro-optic phase modulator.

In some cases, a circulator couples the laser beam from the semiconductor laser to the optical isolator. In these cases, the second portion of the laser beam is fed into the semiconductor laser through the circulator.

Another example of the present technology is a laser system that includes a semiconductor laser, an optical isolator in optical communication with the semiconductor laser, a first modulator in optical communication with the optical isolator, a reference cavity in optical communication with the first modulator, a photodetector in optical communication with the reference cavity, locking circuitry operably coupled to the photodetector, a second modulator in optical communication with the optical isolator and operably coupled to the locking circuitry, and at least one beam-directing element in optical communication with the modulator. In operation, the semiconductor laser emits a laser beam. The optical isolator prevents the laser beam from reflecting back toward the semiconductor laser. The first modulator modulates a first portion of the laser beam with a local oscillator, and the reference cavity reflects the first portion of the laser beam. The photodetector generates a photodetector signal in response to the first portion of the laser beam reflected by the reference cavity. The locking circuitry generates a feedback signal from the photodetector signal. The second modulator modulates a second portion of the laser beam with the feedback signal. And the beam-directing element directs the second portion of the laser beam into the semiconductor laser so as to stabilize a frequency of the laser beam.

The locking circuitry may include a mixer operably coupled to the photodetector, a feedback circuit operably coupled to the mixer, and an amplifier operably coupled to the mixer. In operation, the mixer mixes the photodetector signal with the local oscillator so as to produce a dispersion signal. The feedback circuit integrates a first copy of the dispersion signal. And the amplifier amplifies a second copy of the dispersion signal.

The second modulator may be disposed in an external cavity having a free spectral range of at least 100 MHz. It may be an electro-optic phase modulator, e.g., with a modulation bandwidth of at least 150 MHz.

The beam-directing element may direct the second portion of the laser beam into the semiconductor laser via a reject port of the optical isolator. It may also comprise a circulator, in optical communication with the semiconductor laser, the optical isolator, and the modulator, that directs the laser beam from the semiconductor laser to the optical isolator and directs the second portion of the laser beam from the modulator to the semiconductor laser.

In some cases, the laser system comprises optical fiber to guide the laser beam among the semiconductor laser, the optical isolator, the first modulator, the reference cavity, the photodetector, the second modulator, and/or the at least one beam-directing element.

Yet another example of the present technology is a laser system with a semiconductor laser, an optical isolator in optical communication with the semiconductor laser, at least one beam splitter in optical communication with the semiconductor laser, a Pound-Drever-Hall locking circuit in optical communication with the beam splitter, an external cavity in optical communication with the beam splitter and a reject port of the optical isolator, and an electro-optic phase modulator disposed in the external cavity and operably coupled to the Pound-Drever-Hall locking circuit. In operation, the semiconductor laser emits a laser beam. The optical isolator prevents the laser beam from reflecting back towards the semiconductor laser. The beam splitter splits the laser beam into at least a first portion, a second portion, and a third portion. The Pound-Drever-Hall locking circuit generates a feedback signal from the first portion of the laser beam. The external cavity couples the second portion into the semiconductor laser via the reject port of the external cavity. And the electro-optic phase modulator modulates the second portion with the feedback signal so as to narrow a linewidth of the third portion.

The external cavity may have has a free spectral range of at least 100 MHz. The electro-optic phase modulator may have a modulation bandwidth of at least about 150 MHz. And the third portion may have a linewidth of less than about 30 Hz.

All combinations of the foregoing concepts and additional concepts discussed in greater detail below (provided such concepts are not mutually inconsistent) are part of the inventive subject matter disclosed herein. In particular, all combinations of claimed subject matter appearing at the end of this disclosure are part of the inventive subject matter disclosed herein. The terminology used herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

DETAILED DESCRIPTION

The inventors have recognized a desire in atomic, molecular, and optical physics for a laser with low levels of high (e.g., ~1 MHz) and low (e.g., ~1 mHz) frequency noise at operating wavelengths where fiber lasers, which typically have <1 Hz intrinsic linewidth, are not typically available. These operating wavelengths include wavelengths less than 1030 nm, between 1100 nm and 1530 nm, between 1620 nm and 1750 nm, and greater than 2100 nm. This frequency noise performance can be achieved by suppressing the high frequency noise of a distributed Bragg reflector (DBR) laser through tunable optical feedback using an electro-optic modulator (EOM) in an external-cavity feedback path with a carefully chosen response. This allows for feedback control over several free-spectral ranges (FSRs) of the external cavity.

A servo-electronic feedback system, which includes a separate reference cavity, controls low frequency noise. The servo-electronic feedback system also includes a lockbox or feedback circuit that drives the EOM in the external cavity. This servo-electronic feedback system maintains laser lock for on the order of hours, sufficiently longer than most experiment run-times. The system can be used as a master laser for an optical trap for ytterbium (Yb) atoms, where the exceedingly low frequency and amplitude noise levels translate to longer lifetimes of atoms in the lattice.

Inventive lasers combine passive and active linewidth narrowing schemes with a simple and robust approach to simultaneously narrow and stabilize the frequency of a DBR laser by placing an EOM within a long external feedback path. While other stabilization systems for fiber lasers have included an intra-cavity EOM, similar attempts for DBR or DFB lasers utilize confocal, whispering gallery, or fiber Fabry-Perot cavities. Compared to these other system, a system with an intra-cavity EOM and optical feedback for a DBR laser has a higher bandwidth and is experimentally useful.

A DFB Laser with External Feedback for Narrow Linewidth

Figure 1:
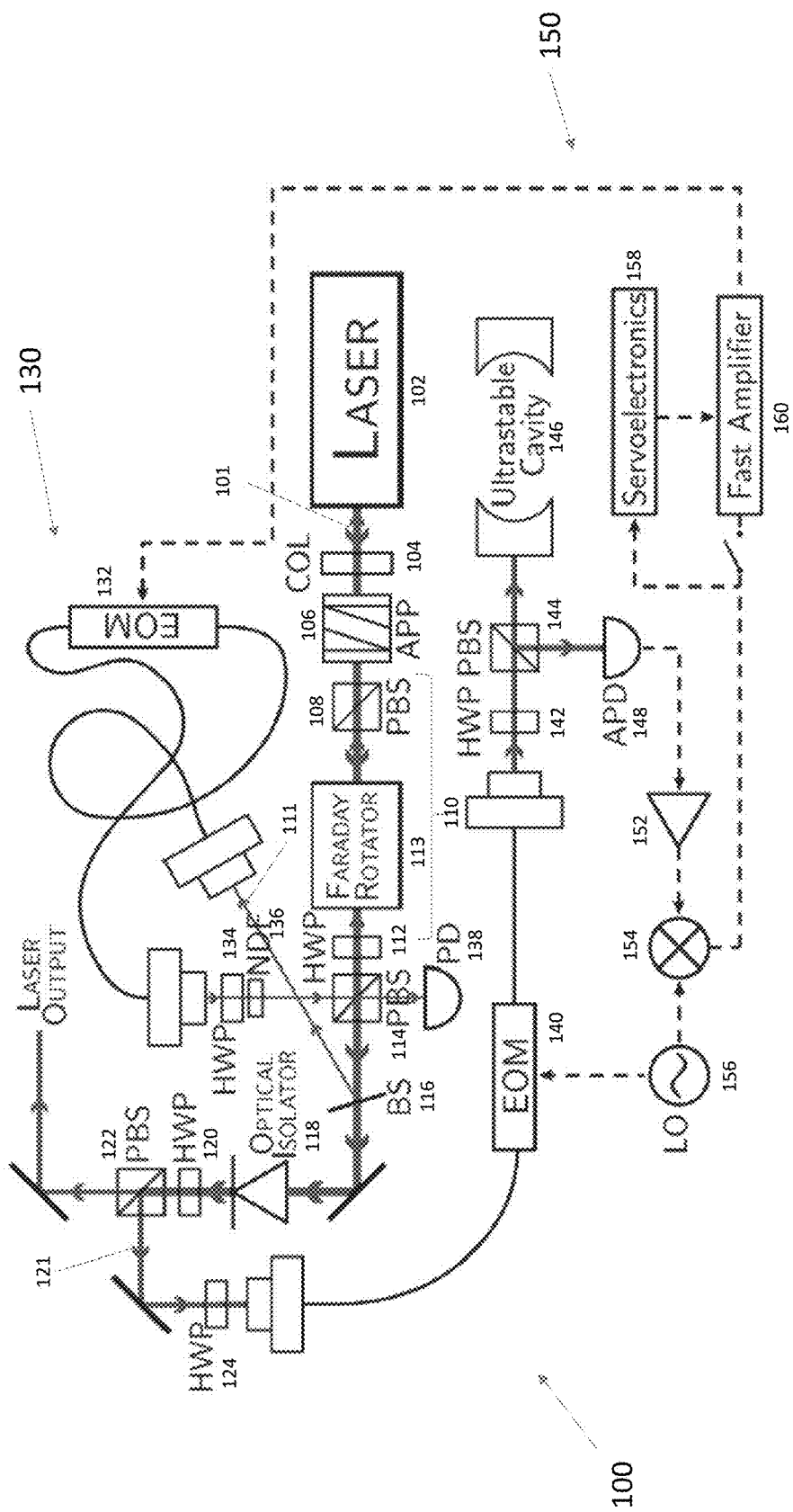
FIG. 1 illustrates a laser system with a DBR laser stabilized using an intra-cavity electro-optic modulator.

FIG. 1 shows an inventive narrow-linewidth laser system 100 with a semiconductor laser 102, such as a DBR or DFB laser, and an intra-cavity EOM 132 in an external cavity 130 whose free spectral range (FSR) is larger than the laser's unstabilized linewidth. In operation, the laser 102 emits a laser beam 101 that is collimated with a collimator 104, expanded with an anamorphic prism pair 106, and passed through a 40 dB optical isolator 110 comprising a first polarizing beam splitter (PBS) 108, Faraday rotator 113, half wave plate (HWP) 112, and a second PBS 114.

A beam sampler 116 picks off ~4% of the beam power as a feedback beam 111 that is sent through a fiber coupler to the intra-cavity EOM 132 and then back into the laser beam path as optical feedback, described in greater detail below. The rest of the laser beam 101 propagates through another optical isolator 118, through another HWP 120, to a third PBS 122. The HWP 120 can be used to adjust the power ratio of the beams emitted by the third PBS 122. The third PBS 122 transmits part of the laser beam 101 to the laser output and couples another part the laser beam 101 to a Pound-Drever-Hall (PDH) locking circuit 150 as a reference beam 121.

The PDH locking circuit 150 uses the reference beam 121 to generate a feedback signal for stabilizing the laser system 100 as follows. The reference beam 121 propagates through a HWP 124 into a reference EOM 140 and from there through a HWP 142 and PBS 144 for power ratio adjustment and into a high-finesse (e.g., with a linewidth of 1 kHz to 1 MHz), ultrastable reference cavity 146. Light coupled out of the ultrastable reference cavity 146 reflects off the PBS 144 to an avalanche photodiode (APD) 148. The EOM 140 modulates the reference beam 121 with a 24 MHz local oscillator (LO) signal from an LO 156, producing a radio-frequency signal measured by the APD 148. An amplifier 152 amplifies the APD output, which is then mixed with the LO signal by a mixer 154 to produce an intermediate-frequency (IF) dispersion signal used for PDH locking. This PDH, or "direct feedback," signal is combined with a lockbox signal from a low frequency-proportional-integral (PI) servo-loop feedback circuit 158 through a fast amplifier 160 that includes two single-pole, low-pass filters each with a −3 dB frequency of 1.4 kHz and differing gain responses. (Without low-pass filtering, the fast amplifier's bandwidth is at least 10 MHz.) The amplifier 160 has a direct current (DC) gain of 40 dB for the direct feedback signal and unity gain for the lockbox signal. The fast amplifier's output drives the intra-cavity EOM 132.

The intra-cavity EOM 132 is in the external cavity 130 and modulates the phase of the feedback beam 111 with the output of the fast amplifier 160. The phase-modulated output of the intra-cavity EOM 132 propagates through a neutral density filter 136 (e.g., with an optical density of 1.0) and another HWP 134, which respectively reduce and allow for the adjustment of the optical feedback power from the intra-cavity EOM 132. A photodiode 138 at one port of the second PBS 114 measures a portion of the feedback power. The second PBS 114 reflects another portion of the feedback beam 111 back through the HWP 112, Faraday rotator 113, and first PBS 108 and into the laser 102. Recalling that the first PBS 108, Faraday rotator 113, HWP 112, and second PBS 114 form the isolator 110, the feedback beam 111 propagates back through the isolator's reject port and into the laser 102, completing the feedback loop and resulting in the open-loop gains shown in FIG. 3.

This setup allows for a maximum ratio of optical feedback power to total laser power (after the anamorphic prism pair 106) of −29.5 dB. This feedback power ratio remains relatively constant for long enough to allow laser stabilization in the long run. Feedback power ratios greater than −35 dB induce coherence collapse and multi-mode behavior in the laser; ratios between −37 dB and −35 dB may render the laser 102 unstable enough to fall into coherence collapse when disturbed by mechanical vibrations, and power ratios less than −49 dB do not improve laser linewidth. The measurements shown in FIGS. 3 and 4 were made with feedback powers between −47 and −35 dB and operate the laser for long-term locking with feedback power near −39 dB.

Locking the laser 102 to the ultrastable reference cavity 146 reduces the noise spectrum of the laser 102 from a free-running value of 10 kHz to 30 Hz (the laser linewidth without optical feedback is about 1 MHz). The lock remains stable for extended periods of time, e.g., several hours. This stability is due part to the fact that the total bandwidth of the feedback loop (the external cavity 130, PDH locking circuit 150, amplifiers, and intra-cavity EOM 132) is smaller than the linewidth of laser 102. This makes it possible to stabilize the laser frequency and narrow the laser's output spectrum. In the example shown in FIG. 1, the external cavity's total path length includes about 1 m of optical fiber and an additional free-space path length and corresponds to a free spectral range (FSR) of 100 MHz. Other external cavities may have FSRs of 10 MHz to 1 GHz, depending on the intrinsic linewidth of the laser 102. A longer external cavities (e.g., a 30 m long cavity with an FSR=10 MHz) should give even better frequency narrowing, at the cost of stability. Conversely, short external cavity (e.g., a 30 cm long cavity with an FSR=1 GHz) should be exceedingly robust, but may be difficult to integrate the fiber EOM into it.

The intra-cavity EOM 132 has a modulation bandwidth of about 150 MHz, which is greater than the 100 MHz FSR of the external cavity 130. Other modulation bandwidths are also possible; for example, modulation bandwidths greater than 1 MHz may be adequate for many situations. Due to the short fiber length and large FSR of the optical feedback fiber loop (external cavity) 130, the laser 102 can be swept over roughly three FSRs, enabling long-term locking to the reference cavity 146 on the order of two hours. The EOM also has a relatively high impedance (e.g., 10,000 ohms), which makes it possible to apply several times the half-wave voltage, Vπm, for tuning the total feedback phase by several waves.

In the system 100 shown in FIG. 1, the actual locking bandwidth is only around 50 kHz, limited by the locking electronics (servoelectronics 158) in the feedback circuit 150. The laser linewidth is suppressed when the feedback bandwidth is greater than the intrinsic laser linewidth (i.e., the linewidth after the optical feedback is considered). In this example, the intrinsic laser linewidth is around 10 kHz, which is why locking narrows the linewidth to only 30 Hz.

Figure 2:
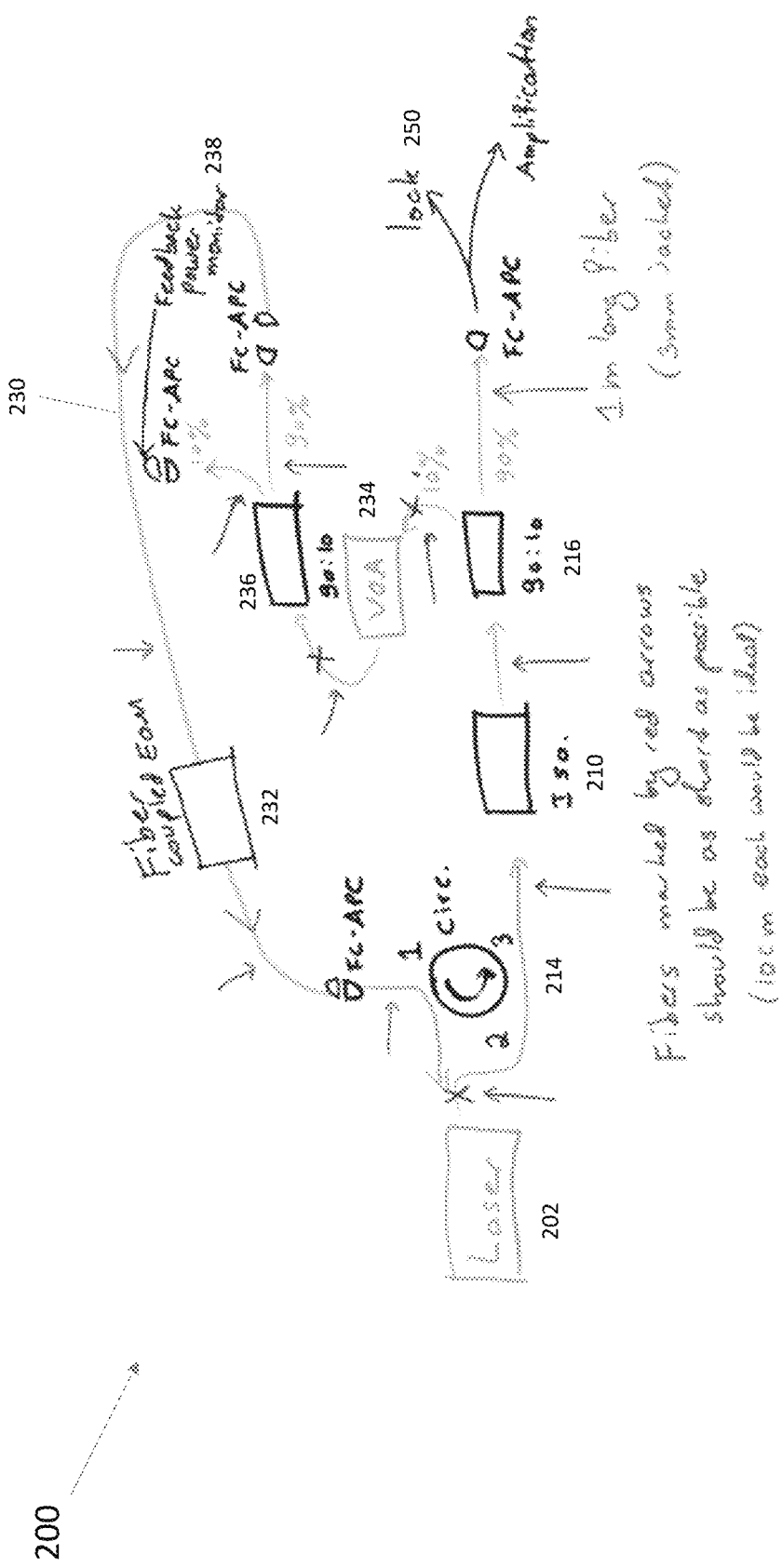
FIG. 2 illustrates an all-fiber laser system with a fiber-coupled DBR laser stabilized using a fiber-coupled intra-cavity electro-optic modulator.

An all-Fiber DFB Laser with External Feedback for Robustness and Narrow Linewidth The laser system 100 in FIG. 1 includes several free-space paths that can be replaced with fiber-optic paths to create an "all-fiber" laser system 200 as shown in FIG. 2. This all-fiber laser system 200 can be more compact, more mechanically robust, and easier to isolate from environmental vibrations and thermal fluctuations than a system with free-space paths. It is especially attractive for commercialization, as it can be constructed from off-the-shelf components without any risk of misalignment by the end user.

FIG. 2 shows that the all-fiber laser system 200 includes a fiber-coupled semiconductor diode laser 202 whose output is coupled directly into Port 2 of a 2-stage, 50 dB return loss circulator 214. The output from Port 3 of the circulator 214 then goes into an additional 30 dB isolator 210 to prevent any reflections from propagating back into the laser 202. A fiber coupler 216 splits the laser beam, with the main 90% output going to an amplification and locking stage (not shown) like the feedback circuit 150 shown in FIG. 1.

The other 10% of the light from the fiber coupler 216 goes to an external cavity 230. A variable optical attenuator 234 (e.g., with an attenuation between 3 and 25 dB) in the external cavity 230 attenuates the beam, which is split again by a second fiber-coupled splitter 236. One of the outputs of this second splitter 236 goes to a feedback power monitoring photodiode 238, while the other output goes into a fiber-coupled intra-cavity EOM 232. A feedback signal from the amplification and locking stage drives the intra-cavity EOM 232, which modulates the phase of the laser beam to compensate frequency noise in the laser's output. Finally, the output of the intra-cavity EOM 232 is coupled to Port 1 of the optical circulator 214, injecting some of the light modulated by the intra-cavity EOM 232 back into the laser 202, and producing the desired line narrowing as explained above.

With the setup shown in FIG. 2, taking into account insertion losses, the feedback power may range from −26 to −48 dB using the 90% output port of the second splitter 236, or −36 to −58 dB with the 10% port. The optical path length of the external cavity 230, with careful fiber splicing, may be about 20 cm for each segment in the feedback path, for a total fiber length of 2 m, which corresponds to a 100 MHz FSR. This is well within the realm of previous demonstrations of fiber feedback lasers and smaller than the intra-cavity EOM's bandwidth. With the intra-cavity EOM 232 and the optical feedback, a lock to a narrow reference cavity of 10 kHz linewidth can easily a linewidth of 1 Hz or less for the laser system 200.

Laser Noise Measurements

The performance of the laser system 100 shown in FIG. 1 can be characterized by sending part of the laser system's output through another fiber-coupled EOM. If the reference beam 121 in FIG. 1 is locked to a first axis of the ultrastable reference cavity 146, the EOM's modulation frequency can be fixed to have a laser sideband resonant with another axis of the ultrastable reference cavity 146 or to another reference cavity. The modulation frequency of this other EOM is fixed such that the laser sideband is on the slope of this second resonance, so that frequency noise is converted efficiently to intensity noise. A DC-coupled APD with a 20 MHz bandwidth detects the transmission of this laser sideband by the cavity 146. A spectrum analyzer coupled to the APD measures the intensity noise in the APD output. This measured intensity noise is converted to frequency noise by a separately measured factor determined from the transmission voltage vs. frequency detuning from the resonance of the second axis of the reference cavity 146.

Figure 3:
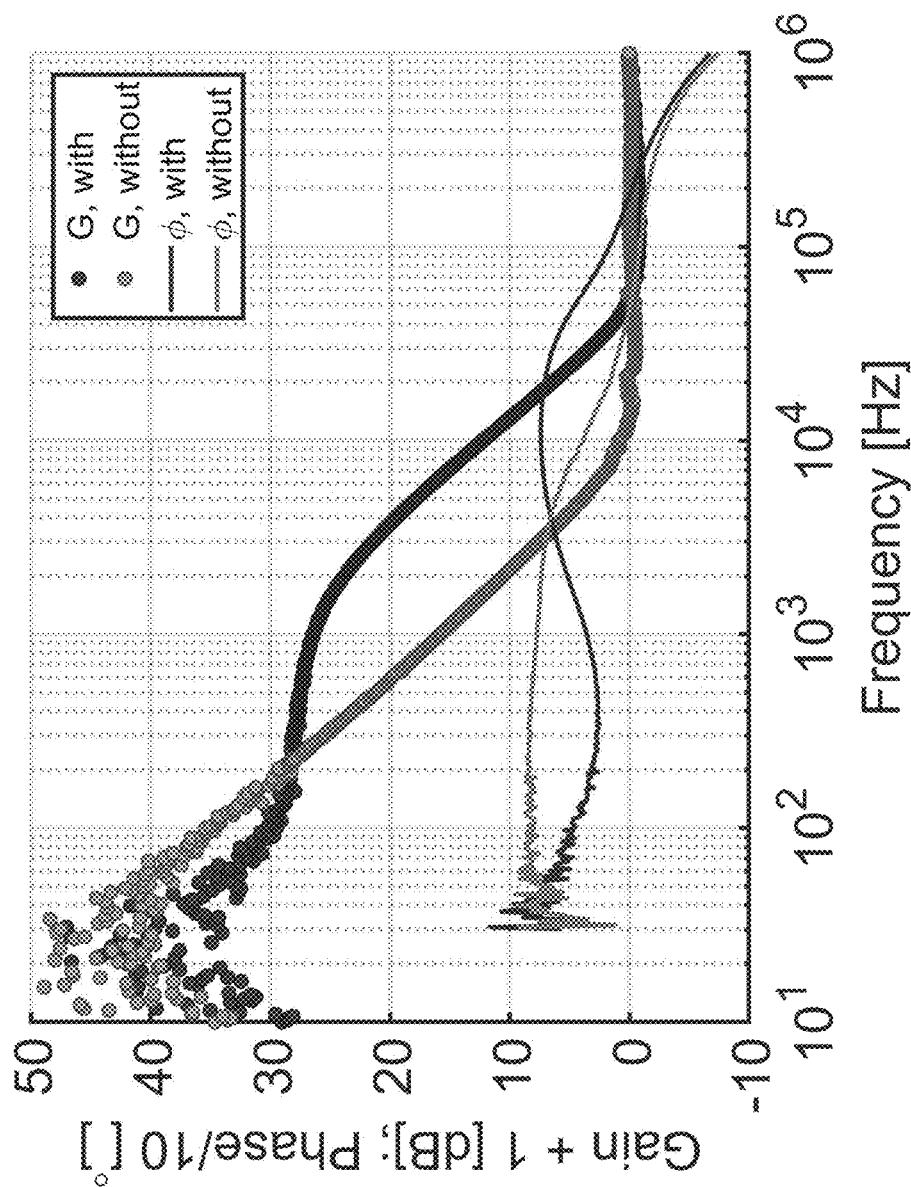
FIG. 3 is a plot of open-loop gain (upper traces) and phase (lower traces) of the feedback loop of the laser shown in FIG. 1. In the legend, "with" indicates that the switch directly routing the PDH error signal to the fast amplifier in FIG. 1 is closed.

FIG. 3 is a plot of open-loop gain in decibels (upper traces) and phase in degrees (lower traces) versus frequency for the laser system 100 of FIG. 1, with and without the direct feedback signal from the fast amplifier 160 driving the intra-cavity EOM 132. Phase-modulating a feedback beam with the direct feedback signal reduces the open-loop gain and phase over a band from about 250 Hz to about 40 kHz.

Figure 4:
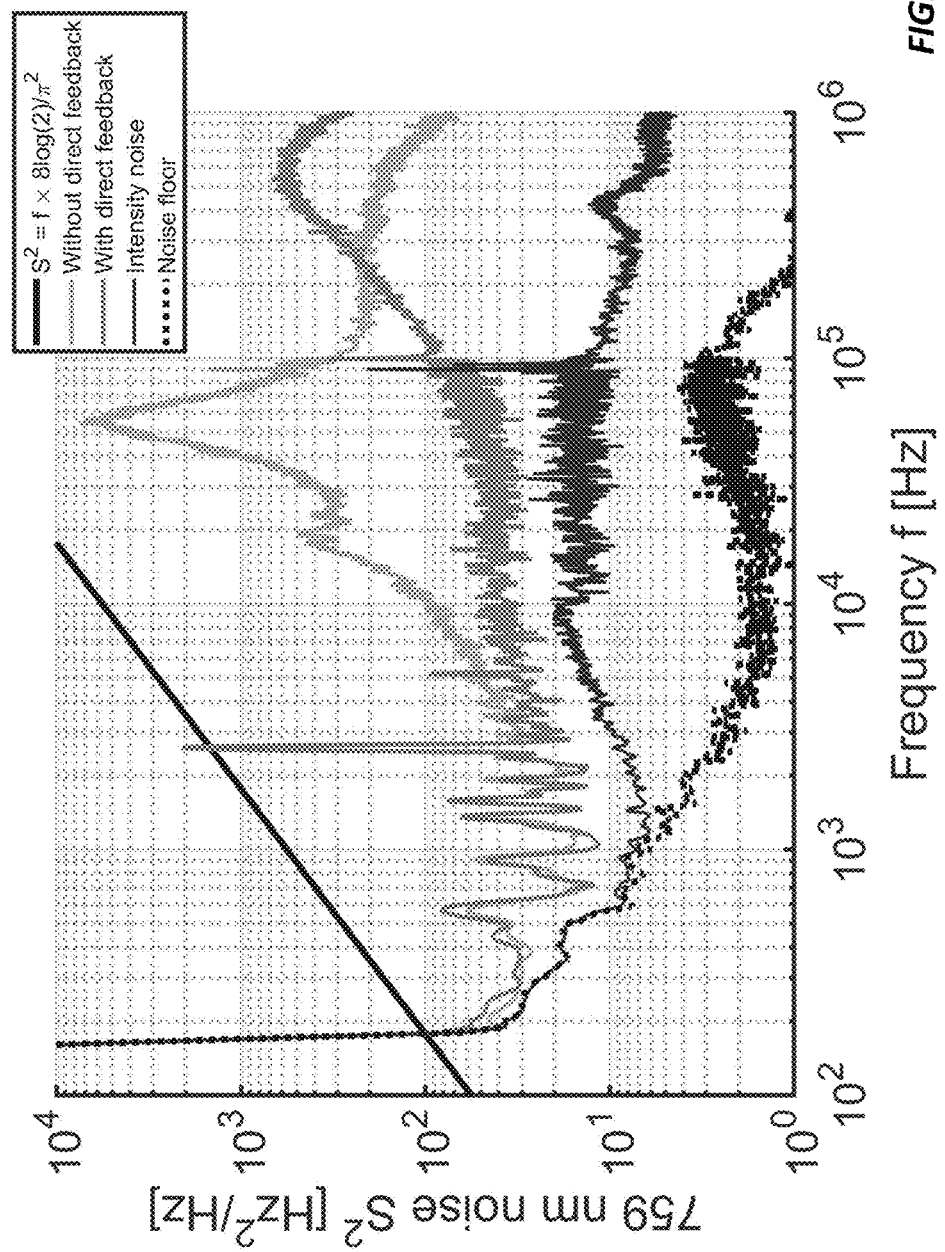
FIG. 4 is a plot of the frequency noise spectrum of the laser shown in FIG. 1.

FIG. 4 shows the laser frequency noise spectrum for the laser system 100 of FIG. 1 as converted from the APD's output voltage using the linewidth of the cavity 146 and the amplitude of the transmission. This type of curve is described in Domenico, G. D., Schilt, S., and Thomann, P., "Simple approach to the relation between laser frequency noise and laser line shape," Appl. Opt. 49, 4801 (2010), which is incorporated herein by reference. Looking at the intersection of the curve with the frequency noise spectrum of the laser provides an indication of the linewidth of the laser.

FIG. 4 also shows the noise floor and laser intensity noise. The noise spectra span a frequency range of 200 Hz<f<1 MHz with and without the direct feedback signal from the fast amplifier 160 driving the intra-cavity EOM 132. The direct feedback effectively suppresses noise for 3 kHz<f<200 kHz and pushes the servo bump frequency out from 60 kHz to 500 kHz, consistent with the 8× increase in the feedback bandwidth. The lock bandwidth is limited by delays in the feedback loop, which leaves room for further optimization. Measurements of the noise floor and laser intensity noise confirm that the measured signal is due to frequency noise.

The laser linewidth can be estimated from the noise spectral density through the technique outlined in G. D. Domenico, S. Schilt, and P. Thomann, *Applied Optics* 49, 4801 (2010) (cited above). When the noise level is large compared to the frequency of the noise, the frequency modulation caused by the noise has a higher amplitude modulation index closer to the center frequency, thus contributing to the linewidth of the laser line-shape. However, when the noise level is small in comparison to the frequency, the modulation index is small and farther from the center frequency, affecting mainly the wings of the laser line shape. Specifically, the noise spectrum can be divided into two regions: (1) the high modulation index region where $S_v(f) > 8 \ln(2) f/\pi^2$ and (2) the low modulation index region where $S_v(f) < 8 \ln(2) f/\pi^2$, where $S_v$ is the noise spectral density as a function of frequency f, leading to the equation:

$$\Gamma_L = \sqrt{8\ln(2)A},$$

where A is the area under the high modulation index region.

Except for the large peak at 2.7 kHz, the laser noise spectrum in FIG. 4 is flat over the entire frequency range of 200 Hz<f<100 kHz and is consistent with a linewidth of 30 Hz. This extremely narrow spectrum is attained despite the 1.4 MHz width of the reference cavity and points the way toward simple and robust lasers with small linewidths at any wavelength attainable with DFB technology. Choosing a reference cavity with a narrower linewidth could result in an even narrower laser linewidth.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of" "only one of" or "exactly one of." "Consisting essentially of" when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method comprising:
    emitting a laser beam from a semiconductor laser;
    transmitting the laser beam through an optical isolator;
    generating a feedback signal from a first portion of the laser beam transmitted through the optical isolator;
    modulating a second portion of the laser beam transmitted through the optical isolator with the feedback signal; and
    feeding the second portion of the laser beam into the semiconductor laser so as to narrow a linewidth of the laser beam.

2. The method of claim 1, wherein generating the feedback signal comprises:
    modulating the first portion of the laser beam with a local oscillator;
    coupling the first portion of the laser beam into a reference cavity;
    detecting light coupled out of the reference cavity with a photodetector in optical communication with the reference cavity; and
    processing a photodetector signal produced by the photodetector in response to detecting the light coupled out of the reference cavity to yield the feedback signal.

3. The method of claim 2, wherein processing the photodetector signal comprises:
    mixing the photodetector signal with the local oscillator to yield a dispersion signal;
    integrating a first copy of the dispersion signal;
    amplifying a second copy of the dispersion signal; and
    combining the first copy of the dispersion signal and the second copy of the dispersion signal to produce the feedback signal.

4. The method of claim 1, wherein modulating the second portion of the laser beam comprises transmitting the second portion of the laser beam through an external cavity having a free spectral range of at least 100 MHz.

5. The method of claim 1, wherein modulating the second portion of the laser beam comprises modulating the second portion of the laser beam over a bandwidth of at least 150 MHz.

6. The method of claim 1, wherein modulating the second portion of the laser beam comprises modulating the second portion of the laser beam with an electro-optic phase modulator.

7. The method of claim 1, wherein feeding the second portion of the laser beam into the semiconductor laser comprises transmitting the second portion of the laser beam through a reject port of the optical isolator.

8. The method of claim 1, further comprising:
    coupling the laser beam from the semiconductor laser to the optical isolator via a circulator, and
    wherein feeding the second portion of the laser beam into the semiconductor laser comprises coupling the second portion of the laser beam through the circulator.

9. A laser system comprising:
    a semiconductor laser to emit a laser beam;
    an optical isolator, in optical communication with the semiconductor laser, to prevent the laser beam from reflecting back toward the semiconductor laser;
    a first modulator, in optical communication with the optical isolator, to modulate a first portion of the laser beam with a local oscillator;
    a reference cavity, in optical communication with the first modulator, to reflect the first portion of the laser beam;
    a photodetector, in optical communication with the reference cavity, to generate a photodetector signal in response to the first portion of the laser beam reflected by the reference cavity;
    locking circuitry, operably coupled to the photodetector, to generate a feedback signal from the photodetector signal;
    a second modulator, in optical communication with the optical isolator and operably coupled to the locking circuitry, to modulate a second portion of the laser beam with the feedback signal; and at least one beam-directing element, in optical communication with the modulator, to direct the second portion of the laser beam into the semiconductor laser so as to stabilize a frequency of the laser beam.

10. The laser system of claim 9, wherein the locking circuitry comprises:
   a mixer, operably coupled to the photodetector, to mix the photodetector signal with the local oscillator so as to produce a dispersion signal;
   a feedback circuit, operably coupled to the mixer, to integrate a first copy of the dispersion signal; and
   an amplifier, operably coupled to the mixer, to amplify a second copy of the dispersion signal.

11. The laser system of claim 9, wherein the second modulator is disposed in an external cavity having a free spectral range of at least 100 MHz.

12. The laser system of claim 9, wherein the second modulator comprises an electro-optic phase modulator.

13. The laser system of claim 9, wherein the second modulator has a modulation bandwidth of at least 150 MHz.

14. The laser system of claim 9, wherein the beam-directing element is configured to direct the second portion of the laser beam into the semiconductor laser via a reject port of the optical isolator.

15. The laser system of claim 9, wherein the beam-directing element comprises a circulator, in optical communication with the semiconductor laser, the optical isolator, and the modulator, to direct the laser beam from the semiconductor laser to the optical isolator and to direct the second portion of the laser beam from the modulator to the semiconductor laser.

16. The laser system of claim 9, further comprising optical fiber to guide the laser beam among the semiconductor laser, the optical isolator, the first modulator, the reference cavity, the photodetector, the second modulator, and/or the at least one beam-directing element.

17. A laser system comprising:
   a semiconductor laser to emit a laser beam;
   an optical isolator, in optical communication with the semiconductor laser, to prevent the laser beam from reflecting back towards the semiconductor laser;
   at least one beam splitter, in optical communication with the semiconductor laser, to split the laser beam into at least a first portion, a second portion, and a third portion;
   a Pound-Drever-Hall locking circuit, in optical communication with the at least one beam splitter, to generate a feedback signal from the first portion of the laser beam;
   an external cavity, in optical communication with the at least one beam splitter and a reject port of the optical isolator, to couple the second portion into the semiconductor laser via the reject port of the external cavity; and
   an electro-optic phase modulator, disposed in the external cavity and operably coupled to the Pound-Drever-Hall locking circuit, to modulate the second portion with the feedback signal so as to narrow a linewidth of the third portion.

18. The laser system of claim 17, wherein the external cavity has a free spectral range of at least 100 MHz.

19. The laser system of claim 17, wherein the electro-optic phase modulator has a modulation bandwidth of at least about 150 MHz.

20. The laser system of claim 17, wherein the third portion has a linewidth of less than about 30 Hz.

* * * * *